United States Patent
Tekumalla et al.

(10) Patent No.: US 8,799,731 B2
(45) Date of Patent: Aug. 5, 2014

(54) CLOCK CONTROL FOR REDUCING TIMING EXCEPTIONS IN SCAN TESTING OF AN INTEGRATED CIRCUIT

(71) Applicant: LSI Corporation, Milpitas, CA (US)

(72) Inventors: Ramesh C. Tekumalla, Breinigsville, PA (US); Prakash Krishnamoorthy, Bethlehem, PA (US); Vijay Sharma, Pune (IN)

(73) Assignee: LSI Corporation, San Jose, CA (US)

( * ) Notice: Subject to any disclaimer, the term of this patent is extended or adjusted under 35 U.S.C. 154(b) by 47 days.

(21) Appl. No.: 13/645,600

(22) Filed: Oct. 5, 2012

(65) Prior Publication Data

US 2014/0101505 A1    Apr. 10, 2014

(51) Int. Cl.
*G01R 31/28*    (2006.01)

(52) U.S. Cl.
USPC ............................. 714/731; 714/729; 714/726

(58) Field of Classification Search
CPC .............................................. G01R 31/318552
USPC .......................... 714/731, 729, 724, 726, 744
See application file for complete search history.

(56) References Cited

U.S. PATENT DOCUMENTS

| | | | |
|---|---|---|---|
| 6,327,684 B1 | 12/2001 | Nadeau-Dostie et al. | |
| 6,438,731 B1 | 8/2002 | Segal | |
| 6,678,644 B1 | 1/2004 | Segal | |
| 7,200,784 B2 * | 4/2007 | Dervisoglu et al. | 714/731 |
| 7,278,074 B2 * | 10/2007 | Mitra et al. | 714/724 |
| 7,346,822 B2 * | 3/2008 | Warren et al. | 714/731 |
| 7,383,481 B2 * | 6/2008 | Warren et al. | 714/726 |
| 7,555,689 B2 | 6/2009 | Goswami et al. | |
| 7,752,515 B2 * | 7/2010 | Dervisoglu et al. | 714/728 |
| 7,831,876 B2 | 11/2010 | Goyal et al. | |
| 2006/0026473 A1 * | 2/2006 | Tan | 714/726 |

OTHER PUBLICATIONS

H. Furukawa et al., "A Novel and Practical Control Scheme for Inter-Clock At-Speed Testing," IEEE International Test Conference (ITC), Oct. 2006, pp. 1-10.

X.-X. Fan et al., "An On-Chip Test Clock Control Scheme for Multi-Clock At-Speed Testing," 16th Asian Test Symposium (ATS), Oct. 2007, pp. 341-348.

R. Press et al., "Easily Implement a PLL Clock Switching for At-Speed Test," Chip Design Magazine, Feb./Mar. 2006, 8 pages.

(Continued)

*Primary Examiner* — Fritz Alphonse
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises a scan chain having a plurality of scan cells. The integrated circuit further comprises a clock distribution network configured to provide clock signals to respective portions of the integrated circuit. The clock distribution network comprises a clock tree having clock signal lines, and clock control elements arranged in respective selected ones of the clock signal lines of the clock tree, where the clock control elements are configured to separate at least one synchronous clock domain into multiple asynchronous clock domains during scan testing. The clock control elements may be configured to reduce a number of timing exceptions produced during scan testing relative to a number of timing exceptions that would otherwise be produced if scan testing were performed using the synchronous clock domain.

24 Claims, 5 Drawing Sheets

(56) References Cited

OTHER PUBLICATIONS

M. Beck et al., "Logic Design for On-Chip Test Clock Generation—Implementation Details and Impact on Delay Test Quality," Proceedings of the Design, Automation and Test in Europe Conference and Exhibition (DATE), Mar. 2005, pp. 56-61, vol. 1.

D. Goswami et al., "At-Speed Testing with Timing Exceptions and Constraints-Case Studies," 15th Asian Test Symposium (ATS), Nov. 2006, pp. 153-162.

X. Lin et al., "Timing-Aware ATPG for High Quality At-Speed Testing of Small Delay Defects," 15th Asian Test Symposium (ATS), Nov. 2006, pp. 139-146.

X. Lin et al., "High-Frequency, At-Speed Scan Testing," IEEE Design & Test of Computers, Sep.-Oct. 2003, pp. 17-25, vol. 20, No. 5.

Stephen Pateras, "Achieving At-Speed Structural Test," IEEE Design & Test of Computers, _Sep.-Oct. 2003, pp. 26-33, vol. 20, No. 5.

L.-T. Wang et al., "Turbo 1500: Core-Based Design for Test and Diagnosis," IEEE Design & Test of Computers, Jan. 2009, pp. 26-35.

U.S. Appl. No. 13/280,797 filed in the name of Ramesh C. Tekumalla et al. on Oct. 25, 2011 and entitled "Dynamic Clock Domain Bypass for Scan Chains."

\* cited by examiner

CLOCK CONTROL FOR REDUCING TIMING EXCEPTIONS IN SCAN TESTING OF AN INTEGRATED CIRCUIT

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of test patterns, and a scan capture phase in which the flip-flops of the scan chain capture combinational logic outputs. These two repeating scan test phases may be collectively referred to herein as a scan test mode of operation of the integrated circuit, or as simply a scan mode of operation. Outside of the scan test mode and its scan shift and scan capture phases, the integrated circuit may be said to be in a functional mode of operation. Other definitions of the scan test and functional operating modes may also be used.

Integrated circuits commonly include multiple clock domains. In an integrated circuit of this type, different portions of the integrated circuit are provided with different clock signals via a clock distribution network. For scan testing purposes, several clock signals having a common frequency but associated with different clock domains may be synchronized with one another. This is often done to facilitate scan testing. However, in some situations this type of simplification can be problematic, in that clock delay defects detected for synchronized clock signals during scan testing may nonetheless permit proper functional operation of the integrated circuit, because the functional operation may not require these clock signals to be synchronous. This can reduce device yield when manufacturing integrated circuits, as the devices failing the scan testing may be rejected for clock delay defects that do not actually interfere with functional operation.

These and other issues are addressed in U.S. patent application Ser. No. 13/401,030, filed Feb. 21, 2012 and entitled "Integrated Circuit Having Clock Gating Circuitry Responsive to Scan Shift Control Signal," which is commonly assigned herewith and incorporated by reference herein. For example, in one embodiment, clock gating circuitry is provided for controlling application of clock signals to respective portions of an integrated circuit at least in part responsive to a scan shift control signal, so as to permit determination of whether or not clock delay defects detected in scan testing will also cause errors during functional operation of the integrated circuit. By utilizing the clock gating circuitry to determine whether a clock delay defect that causes a scan error during scan testing will also cause a functional error during functional operation, device yield in an integrated circuit manufacturing process can be significantly improved.

Despite the considerable advances provided by the techniques disclosed in the above-cited patent application, a need remains for further improvements. For example, in certain integrated circuits subject to scan testing, multiple clock domains that are asynchronous in functional operation are nonetheless grouped together as a synchronous clock domain for purposes of scan testing. This can lead to a situation in which many of the timing exceptions that arise in at-speed scan capture are not actual violations that will occur during functional operation. An excessive number of such erroneous scan-related timing exceptions can unduly complicate test pattern generation, leading to significant negative impacts on both test time and fault coverage.

SUMMARY

Embodiments of the invention provide integrated circuits having clock distribution networks that include clock control elements inserted in selected clock signal lines. The signal lines that incorporate clock control elements are selected in a manner that significantly reduces the number of timing exceptions that arise when scan testing the integrated circuit, particularly during at-speed scan capture.

In one embodiment, an integrated circuit comprises scan test circuitry and additional circuitry subject to testing utilizing the scan test circuitry. The scan test circuitry comprises a scan chain having a plurality of scan cells. The integrated circuit further comprises a clock distribution network configured to provide clock signals to respective portions of the integrated circuit. The clock distribution network comprises a clock tree having a plurality of clock signal lines, and a plurality of clock control elements arranged in respective selected ones of the clock signal lines of the clock tree, where the clock control elements are configured to separate at least one synchronous clock domain into multiple asynchronous clock domains during scan testing. Appropriate insertion and configuration of the clock control elements can serve to significantly reduce the number of timing exceptions produced during scan testing relative to the number of timing exceptions that would otherwise be produced if scan testing were performed using the synchronous clock domain.

By way of example, the synchronous clock domain may be defined as a synchronous clock domain for purposes of scan testing but may be separable into the plurality of asynchronous clock domains by the clock control elements for one or more at-speed scan capture phases of the scan testing.

The particular clock signal lines of the clock tree that are selected to include the clock control elements may be selected based on a static timing analysis of the integrated circuit design that involves comparing a number of timing exceptions produced during scan testing with a number of timing exceptions produced during functional operation. More particularly, the particular clock signal lines of the clock tree that are selected to include the clock control elements may be selected such that the number of timing exceptions produced during scan testing is no more than a specified amount greater than the number of timing exceptions produced during functional operation.

The use of selective insertion of clock control elements in clock signal lines of a clock tree significantly reduces the number of timing exceptions that are attributable to grouping of clock signals for purposes of scan testing. This considerably facilitates test pattern generation, leading to reduced test time and improved fault coverage.

DETAILED DESCRIPTION

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved control of clock signals in a clock distribution network of the integrated circuit in a manner that reduces timing exceptions during scan testing.

Figure 1:
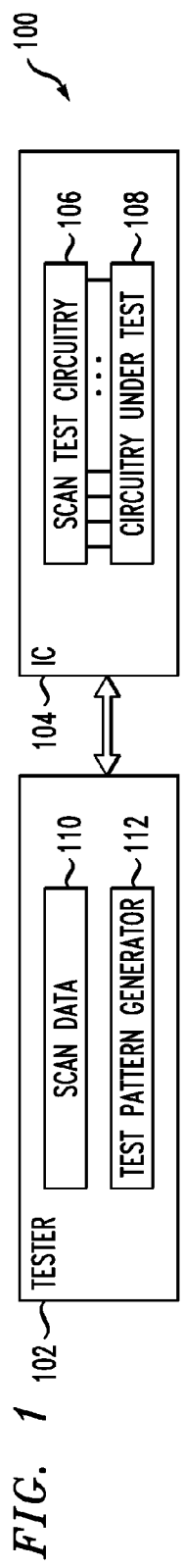
FIG. 1 is a block diagram showing an integrated circuit testing system comprising a tester and an integrated circuit under test in one embodiment.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The test pattern generator 112 may be implemented as an automatic test pattern generator (ATPG), and may be viewed as an example of what is more generally referred to herein as a test generation tool.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

The integrated circuit 104 may be configured for installation on a circuit board or other mounting structure in a computer, server, mobile telephone or other type of communication device. Such communication devices may also be viewed as examples of what are more generally referred to herein as "processing devices." The latter term is also intended to encompass storage devices, as well as other types of devices comprising data processing circuitry.

Embodiments of the present invention may be configured to utilize compressed or noncompressed scan testing, and embodiments of the invention are not limited in this regard. However, the embodiment shown in FIG. 2 will be described primarily in the context of compressed scan testing.

Figure 2:
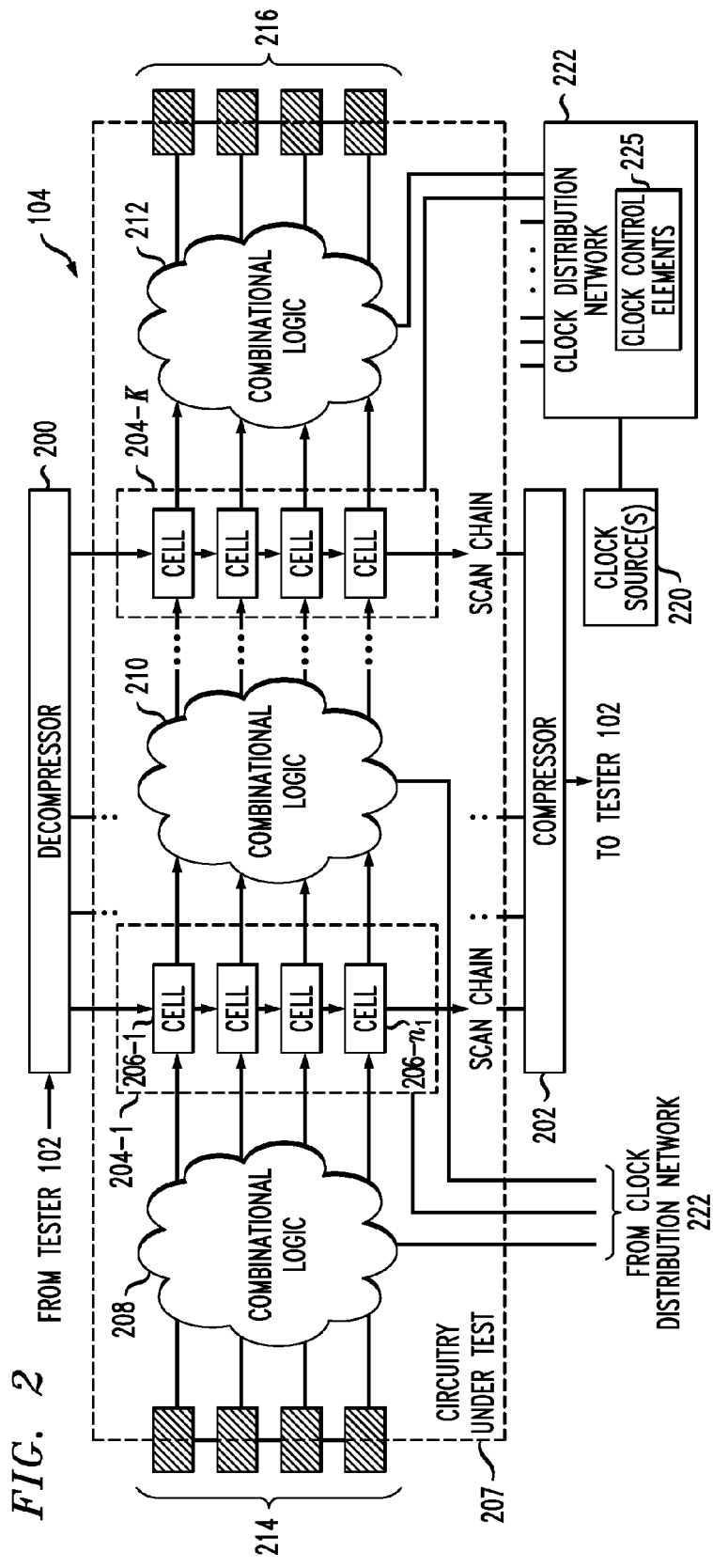
FIG. 2 shows a more detailed view of a portion of the integrated circuit in the testing system of FIG. 1.

Referring now to FIG. 2, portions of one potential configuration of the integrated circuit 104 are shown in greater detail. In this compressed scan testing arrangement, the scan test circuitry 106 comprises a decompressor 200, a compressor 202, and a plurality of scan chains 204-$k$, where k=1, 2, . . . K.

Each of the scan chains 204 comprises a plurality of scan cells 206. A scan shift control signal is utilized to cause the scan cells 206 of at least a given one of the scan chains 204 to form a serial shift register during scan testing. The scan shift control signal may comprise, for example, a scan enable (SE) signal, such that the scan cells of the given scan chain form the serial shift register responsive to the SE signal being at a first designated logic level (e.g., a logic "1" level) and the scan cells capture functional data when the SE signal is at a second designated logic level (e.g., a logic "0" level). A single SE signal may be used to control all of the scan chains 204, or only a subset of those scan chains, with the remaining scan chains being controlled using one or more other SE signals. The SE signal in the present embodiment basically controls configuration of scan cells of a scan chain to form a serial shift register for shifting in and shifting out of test patterns. The SE signal may therefore be considered a type of scan shift enable signal, or more generally, a type of scan shift control signal.

When the scan chains 204 are configured to form respective serial shift registers for shifting in and shifting out scan test data associated with one or more test patterns to be applied by the tester 102, the scan test circuitry may be said to be in a scan shift phase of a scan test mode of operation. It should be appreciated, however, that a wide variety of other types of scan shift control signals and sets of integrated circuit operating modes and phases may be used in other embodiments. These embodiments therefore do not require the use of any particular definition of operating modes and phases.

The scan chains 204 may be associated with multiple distinct clock domains, or a single clock domain. It will be assumed in some embodiments that at least one of the scan chains 204 is a multiple clock domain scan chain, that is, a scan chain comprising sub-chains associated with respective distinct clock domains. Such sub-chains of a multiple clock domain scan chain may be separated from one another by lockup latches. Also, one or more of the sub-chains may be selectively bypassed using clock domain bypass circuitry so as to not be part of the serial shift register formed by the scan chain in the scan shift phase. For example, such clock domain bypass circuitry may be configured to bypass one or more of the sub-chains that are determined to be inactive for a particular test pattern, and the clock domain bypass circuitry may bypass different ones of the sub-chains for different test patterns. Additional details regarding clock domain bypass circuitry that may be utilized in embodiments of the invention may be found in U.S. patent application Ser. No. 13/280,797, filed Oct. 25, 2011 and entitled "Dynamic Clock Domain Bypass for Scan Chains," which is commonly assigned herewith and incorporated by reference herein.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift a desired set of scan test patterns into all of the scan chains. It may therefore be assumed without limitation that all of the scan chains 204 are of the same length n, such that $n_1 = n_2 = \ldots = n_k = n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift phase of the scan shift mode of operation. The compressor 202 of the scan test circuitry 106 receives scan test output data shifted out of the scan chains 204, also when such chains are configured as respective serial shift registers in the scan shift phase of the scan shift mode of operation, and compresses that scan test output data for delivery back to the tester 102.

Compressed scan input data is applied by tester 102 to M scan inputs of decompressor 200, and compressed scan output data is provided from compressor 202 back to tester 102 via M scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift phase of a scan test mode of operation of the integrated circuit 104 and also to capture functional data from combinational logic elements. The capture of functional data may be said to occur in a capture phase of the scan test mode. Again, other arrangements of operating modes and phases may be used in other embodiments.

The number K of scan chains 204 is generally much larger than the number M of decompressor inputs or compressor outputs. The ratio of K to M provides a measure of the degree of scan test pattern compression provided in the scan test circuitry 106. It should be noted, however, that the number of compressor outputs need not be the same as the number of decompressor inputs. For example, there may be M decompressor inputs and P compressor outputs, where M ≠ P but both M and P are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in U.S. Pat. No. 7,831,876, entitled "Testing a Circuit with Compressed Scan Chain Subsets," which is commonly assigned herewith and incorporated by reference herein. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. As noted above, such scan shift phases may be viewed as being part of a scan test mode of operation of the integrated circuit 104.

In the FIG. 2 embodiment, the integrated circuit 104 comprises one or more clock sources 220 coupled to a clock distribution network 222 that is configured to provide a plurality of clock signals to respective portions of the integrated circuit 104. A given "portion" of an integrated circuit as that term is used herein is intended to be broadly construed, and should be understood to encompass any circuit element or other identifiable component, or set of such elements or other components, that are implemented within the integrated circuit. For example, the clock distribution network in the present embodiment provides clock signals to the scan chains 204 and to the combinational logic blocks 208, 210 and 212. The clock distribution network 222 further comprises clock control elements 225 that are arranged in respective selected clock signal lines of at least one clock tree. The clock control elements 225 are configured to separate at least one synchronous clock domain into a plurality of asynchronous clock domains during scan testing of the integrated circuit 104.

More particularly, in the present embodiment the clock control elements 225 are illustratively configured to reduce a number of timing exceptions produced during scan testing, relative to a number of timing exceptions that would otherwise be produced during scan testing if scan testing were performed using the corresponding synchronous clock domain. The synchronous clock domain in this embodiment is assumed to be defined as a synchronous clock domain for purposes of scan testing but is separable into the plurality of asynchronous clock domains by the clock control elements 225 for at least an at-speed capture portion of the scan testing.

An exemplary technique for insertion of clock control elements in selected clock signal lines of clock distribution network 222 will now be described with reference to FIGS. 3A, 3B, 3C and 3D.

Figure 3A:
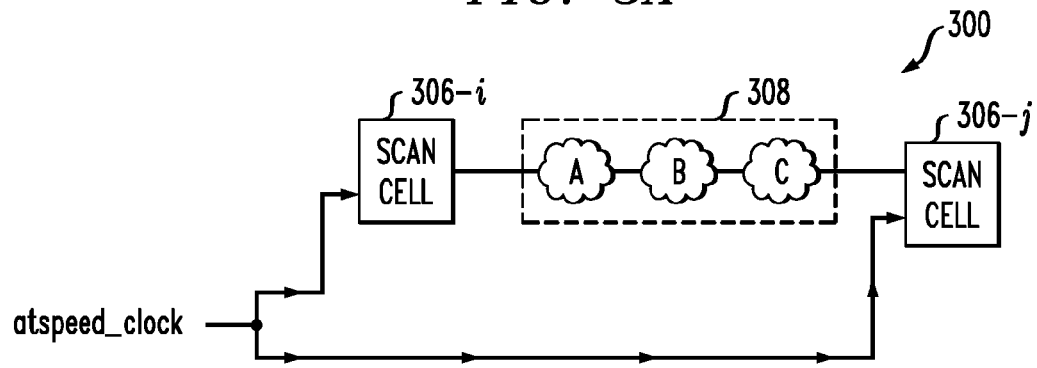
FIGS. 3A, 3B, 3C and 3D illustrate the insertion of clock control elements in respective clock signal lines of a clock distribution network in the FIG. 2 integrated circuit.

FIG. 3A illustrates a portion 300 of the integrated circuit 104 prior to insertion of clock control elements. The portion 300 comprises a source scan cell 306-$i$ and a destination scan cell 306-$j$ associated with a particular timing path of the integrated circuit during at-speed scan capture. The two scan cells 306 are part of a synchronous clock domain driven by a scan capture clock signal denoted as atspeed_clock. The atspeed_clock is applied to respective clock inputs of both of the scan cells 306. A data output of the scan cell 306-$i$ drives an input of logic block A and an output of logic block C drives a data input of the scan cell 306-*j*. The source scan cell 306-*i* therefore launches data into logic block A that passes through logic blocks B and C and is eventually captured by the destination scan cell 306-*j*. The values i and j may represent a pair of consecutive values in the range from 1 to n, where n denotes the length of the corresponding scan chain.

Assume that the timing path illustrated in FIG. 3A fails to meet timing requirements and therefore leads to a timing exception during at-speed capture. The timing exception may be an actual timing exception in functional mode, in which case it should be provided to the test pattern generator 112 for use in generating test patterns. Such actual timing exceptions can arise from a variety of different types of timing violations, and are also intended to include multi-cycle paths that require more than one clock cycle for a given data signal to be captured from the time it is launched.

Figure 3B:
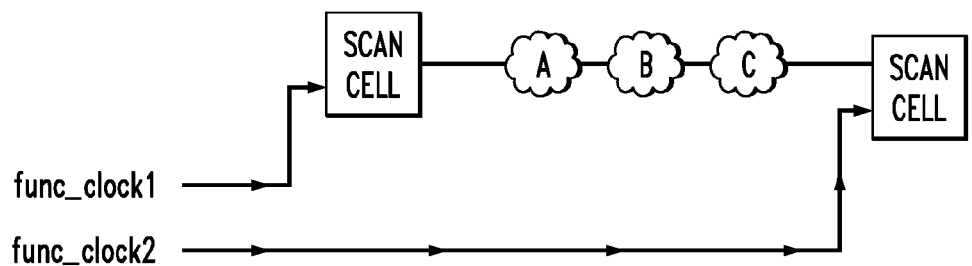

However, the timing exception could instead be a false timing exception, that arises only during scan testing because in functional mode the two scan cells 306 are driven by two different functional clocks from different clock domains, as illustrated in FIG. 3B. These two different functional clocks are denoted func_clock1 and func_clock2 in the figure. In this embodiment, the timing exception arises only because the asynchronous clock domains of func_clock1 and func_clock2 in the functional mode have been combined into the synchronous clock domain of atspeed_clock for purposes of scan testing.

Figure 3C:
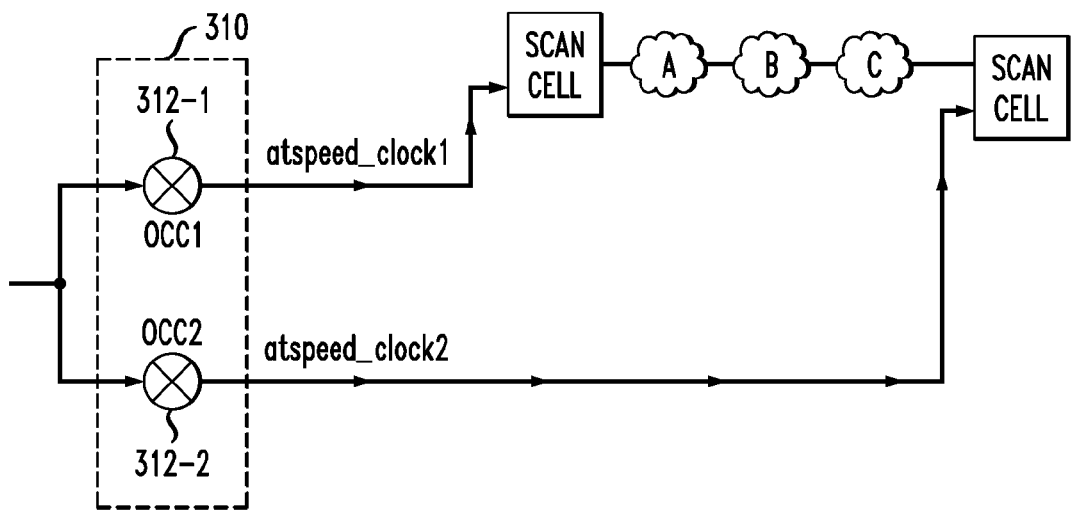

This problematic situation may be addressed in the manner illustrated in FIG. 3C. More particularly, a set of clock control elements 310 comprises first and second clock control elements 312-1 and 312-2 inserted in respective branches of a clock tree providing the original atspeed_clock clock signal. This allows the test pattern generator 112 to treat the two clock signals atspeed_clock1 and atspeed_clock2 as asynchronous clocks for purposes of at-speed scan capture, thereby avoiding generation of a timing exception for this timing path during scan testing.

The above-described approach can be applied to identify and address other similar situations relating to timing exceptions identified during scan testing, and a significant overall reduction in the number of timing exceptions provided to the test pattern generator 112 can be achieved. By significantly reducing the number of timing exceptions that are not actual functional mode timing exceptions but instead arise only during scan testing, test pattern generation is considerably facilitated, leading to significantly reduced test time and improved fault coverage.

It should be noted that the clock tree providing the original atspeed_clock clock signal in FIG. 3A has a stem signal line and two branch signal lines, and a clock control element 312 is inserted in each of the two branch signal lines. However, numerous other arrangements are possible, and the term "clock tree" as used herein is intended to be broadly construed so as to encompass these other arrangements. For example, a clock control element may be inserted in a portion of a clock tree that is separate from the stem signal line but nonetheless feeds multiple distinct branch signal lines that originate from the stem signal line. As another example, a given stem signal line associated with a particular clock signal and a given branch signal line also associated with that same clock signal may be configured to include respective clock control elements. The stem and branch signal lines may be viewed as examples of respective root locations of particular clock signals. Additional examples will be described in more detail with reference to FIGS. 4 through 6 below.

Figure 3D:
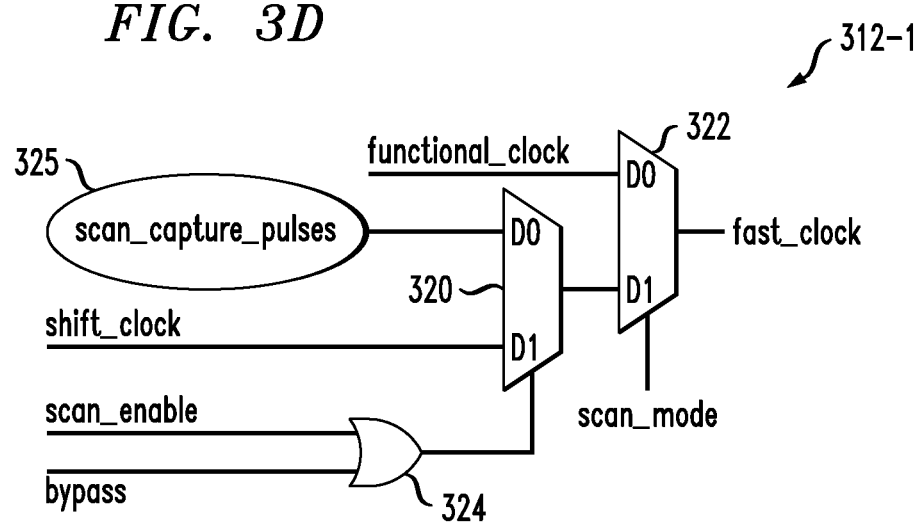

FIG. 3D shows one of the clock control elements 312-1 in greater detail. In this embodiment, the clock control element 312-1 is configured to multiplex between a functional clock signal, a scan capture clock signal and a scan shift clock signal responsive to scan enable and scan mode signals. The other clock control element 312-2 in the set 310 is assumed to be configured in a similar manner.

The exemplary clock control element 312-1 as illustrated in the figure comprises a pair of two-to-one multiplexers 320 and 322 and an OR gate 324. A scan capture clock signal comprising scan_capture_pulses 325 is applied to a D0 input of the multiplexer 320, and a shift clock signal denoted shift_clock is applied to a D1 input of the multiplexer 320. A select signal input of the multiplexer 320 is driven by an output of the OR gate 324, which receives as its inputs a scan enable signal denoted scan_enable and a bypass signal. A functional clock signal denoted functional_clock is applied to a D0 input of the multiplexer 322. The output of the multiplexer 320 is applied to a D1 input of the multiplexer 322. The output of the multiplexer 322 is an at-speed clock signal denoted fast_clock. A select signal input of the multiplexer 322 is driven by a scan mode signal denoted scan_mode, which illustratively is at a logic high level during a scan test mode of operation of the integrated circuit 104 and at a logic low level during a functional mode of operation of the integrated circuit 104.

If either the scan_enable or bypass signal is at a logic high level, multiplexer 320 selects the shift_clock for application to the D1 input of multiplexer 322, and otherwise selects the scan_capture_pulses. If scan_mode is at a logic high level, indicating that the integrated circuit is in a scan test mode of operation, the selected one of shift_clock or scan_capture_pulses is passed through to the fast_clock output of multiplexer 322. Otherwise, the integrated circuit is in a functional mode of operation, scan_mode is at a logic low level, and the functional_clock is passed to the fast_clock output.

It is to be appreciated that the particular clock control element configuration illustrated in FIG. 3D is presented by way of illustrative example only, and numerous other arrangements of circuitry and control signaling may be used to implement a given clock control element in other embodiments.

The particular clock signal lines of a given clock tree in clock distribution network 222 that are selected to include the clock control elements may be selected based on a static timing analysis of the integrated circuit design that involves comparing a number of timing exceptions produced during scan testing with a number of timing exceptions produced during functional operation. More specifically, the particular clock signal lines of the clock tree that are selected to include the clock control elements may be selected such that the number of timing exceptions produced during scan testing is no more than a specified amount greater than the number of timing exceptions produced during functional operation. For example, it is generally desirable to reduce the number of timing exceptions produced during scan testing to no more than about one or two times the number of timing exceptions produced during functional operation.

As a more particular example, a process for insertion of clock control elements may proceed in the following manner. Given an integrated circuit design incorporating multiple scan chains, this exemplary process begins with static timing analysis performed on the design in functional mode and in scan mode. The latter more particularly comprises at-speed scan capture portions of the scan mode.

The functional timing analysis uses functional constraints to create a list of timing paths that meet or break specified timing requirements, which may include set-up time and hold time requirements, as well as other types of timing requirements. The scan mode also generates a list of timing paths that meet or break specified timing requirements during at-speed scan capture. The list of timing paths that do not meet timing requirements in functional mode are referred to in this example as the list of violators and the list of timing paths that do not meet timing in the at-speed scan capture portions of scan mode are referred to in this example as the list of exceptions.

If the number of violators is approximately the same as the number of exceptions, there is no need to insert clock control elements on any of the clock signal lines, as there is no opportunity for significant reduction in the number of exceptions.

However, if the number of exceptions is substantially larger than the number of violators, the number of exceptions can typically be reduced. This part of the exemplary process involves first identifying whether asynchronous clocks defined in the functional mode are defined as synchronous clocks in the scan mode. If that is the case, a list of all such asynchronous clocks is prepared and their respective clock root locations are identified. Also, fanouts are determined for each of these clocks.

Starting with the clock having the largest fanout, a clock control element is inserted at its root location in order to provide a capability to independently control the clock in scan mode. A static timing analysis is run in scan mode with this clock set as asynchronous with respect to the rest of the clocks, and the number of exceptions is tracked. This step can reduce the number of exceptions in scan mode by the number of timing paths that involve this clock either feeding launch or capture scan cells, but not both.

These operations are then repeated for the asynchronous clock with the next largest fanout, with a clock control element inserted at its root location, the static timing analysis run in scan mode with this clock set as asynchronous with respect to the rest of the clocks, and the number of exceptions tracked.

The process stops when either the list of exceptions in scan mode has converged to the number of violations in functional mode or when the number of exceptions in scan mode has been reduced to a number than is reasonably small so that it can be masked by the test generation tool without significant negative impact on test time or fault coverage. The process will typically result in an arrangement in which the number of inserted clock control elements is equal to or less than the number of independent clocks in functional mode.

Aspects of the exemplary process described above will now be illustrated in more detail with reference to FIGS. 4, 5 and 6.

Figure 4:
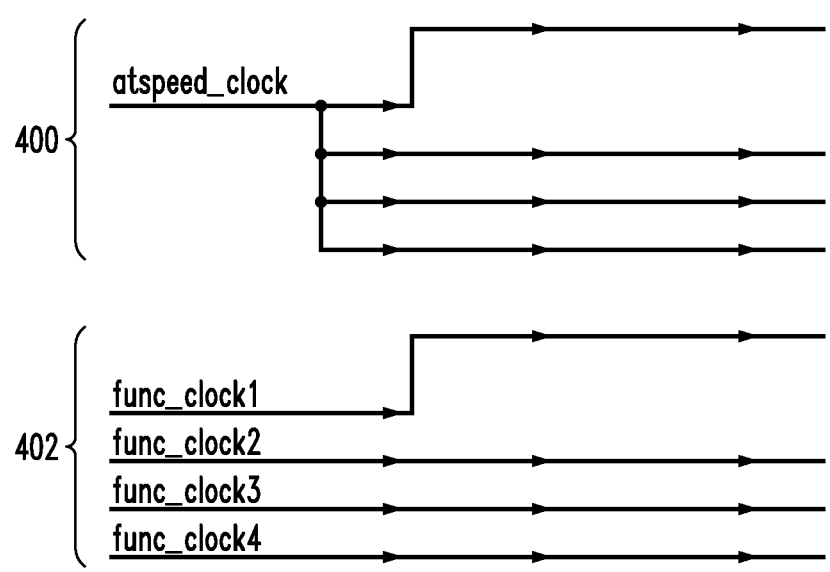
FIG. 4 shows a portion of a clock distribution network.

Referring now to FIG. 4, a portion of a clock distribution network is shown. This portion includes the synchronous clock signal lines 400 shown in the upper portion of the figure, which collectively comprise a clock tree driven by the atspeed_clock signal. The lower portion of the figure indicates that this particular scan mode synchronous clock signal actually corresponds in function mode to four distinct asynchronous functional mode clock signals, denoted func_clock1, func_clock2, func_clock3 and func_clock4, which are carried by respective asynchronous clock signal lines 402. Thus, the four functional clock signals func_clock1, func_clock2, func_clock3 and func_clock4 are merged into the single synchronous signal atspeed_clock in scan mode.

Figure 5:
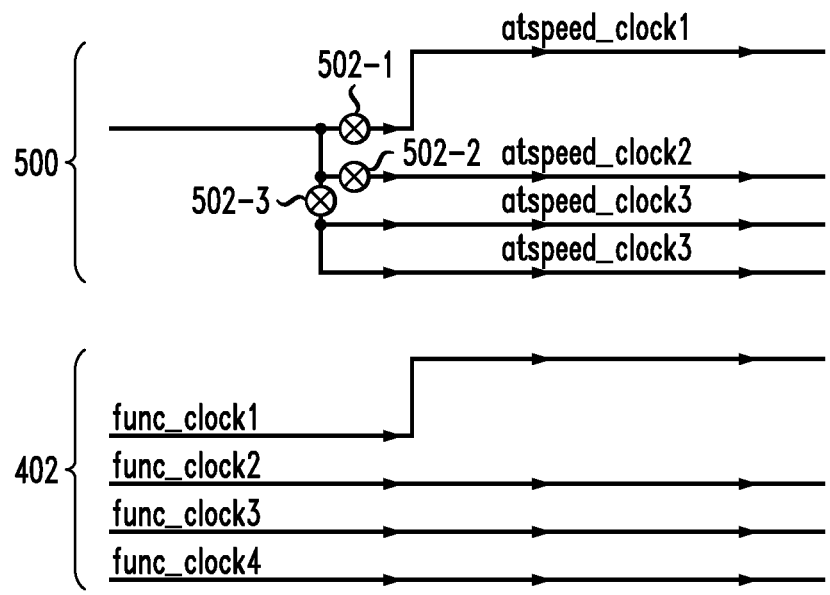
FIGS. 5 and 6 illustrate different possible modifications of the FIG. 4 clock distribution network to incorporate clock control elements.
Figure 6:
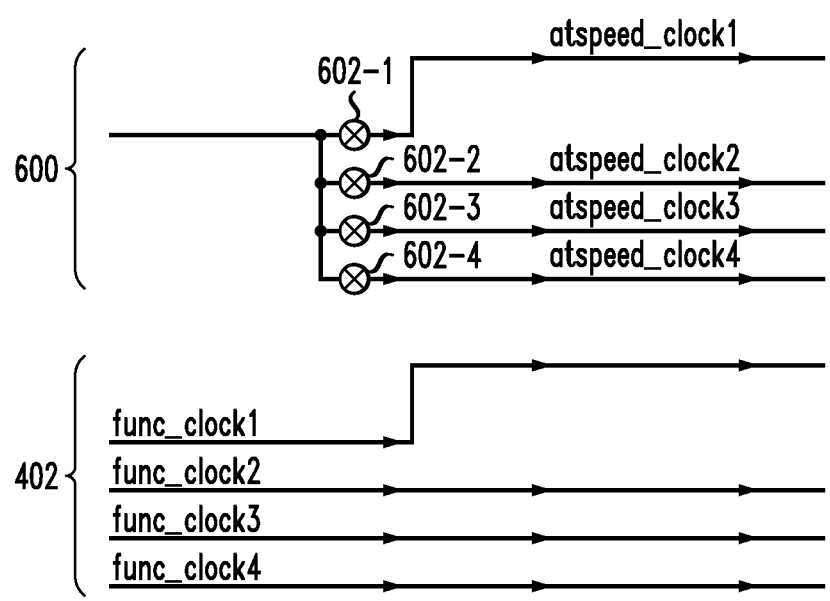

FIGS. 5 and 6 illustrate different possible modifications of the clock tree 400 of FIG. 4 in accordance with respective embodiments. The functional mode configuration of the clock signal lines 402 is repeated in the lower portion of each of FIGS. 5 and 6 for reference. It is assumed for these examples that the number of exceptions in scan mode is far greater than the number of violators in functional mode.

In the embodiment illustrated in FIG. 5, it is further assumed that the static timing analysis shows that scan mode timing exceptions are created in timing paths spanned by func_clock1 and func_clock2, but no scan mode timing exceptions are created in timing paths spanned by func_clock3 and func_clock4. In other words, timing requirements are met for all timing paths in scan mode for the roots associated with func_clock3 and func_clock4.

For this embodiment, in the clock tree 500, two clock control elements 502-1 and 502-2 are inserted at the respective root locations of func_clock1 and func_clock2, and one additional clock control element 502-3 is inserted at the common root location of func_clock3 and func_clock4. Accordingly, as noted above, the number of inserted clock control elements is equal to or less than the number of independent clocks in functional mode. The number of inserted clock control elements is less than the number of independent functional clocks in this embodiment because the clock control insertion takes advantage of the fact that timing is met for the entire clock domain spanned by func_clock3 and func_clock4. The single synchronous clock tree 400 in FIG. 4 has therefore been structurally modified to produce clock tree 500, through the addition of three clock control elements 502 to create three asynchronous clocks denoted atspeed_clock1, atspeed_clock2 and atspeed_clock3. The resulting arrangement will reduce the number of exceptions in scan mode and bring it more in line with the number of violations seen in functional mode.

In the embodiment illustrated in FIG. 6, it is further assumed that the static timing analysis shows that scan mode timing exceptions are created in timing paths spanned by each of the clocks func_clock1, func_clock2, func_clock3 and func_clock4. In other words, timing requirements are not met in scan mode for any of the roots associated with the clocks func_clock1, func_clock2, func_clock3 and func_clock4.

For this embodiment, in the clock tree 600, four clock control elements 602-1, 602-2, 602-3 and 602-4 are inserted at the respective root locations of func_clock1, func_clock2, func_clock3 and func_clock4. Again, as noted above, the number of inserted clock control elements is equal to or less than the number of independent clocks in functional mode. The single synchronous clock tree 400 in FIG. 4 has therefore been structurally modified to produce clock tree 600, through the addition of four clock control elements 602 to create four asynchronous clocks denoted atspeed_clock1, atspeed_clock2, atspeed_clock3 and atspeed_clock4. The resulting arrangement will reduce the number of exceptions in scan mode and bring it more in line with the number of violations seen in functional mode.

It is to be appreciated that the particular circuitry arrangements shown in FIGS. 1-6 are presented by way of illustrative example only, and numerous alternative arrangements of scan test circuitry, clock distribution networks and clock control elements may be used to implement the described functionality. This functionality can be implemented in one or more of the embodiments without any significant negative impact on integrated circuit area requirements or functional timing requirements.

As mentioned previously, the presence of clock control elements of the type described above within integrated circuit 104 may be made apparent to a test patter generator or other test generation tool so that the tool can take the associated functionality into account in generating test patterns. In order to accomplish this, one or more input files describing the operation of this circuitry may be provided to the test generation tool.

Figure 7:
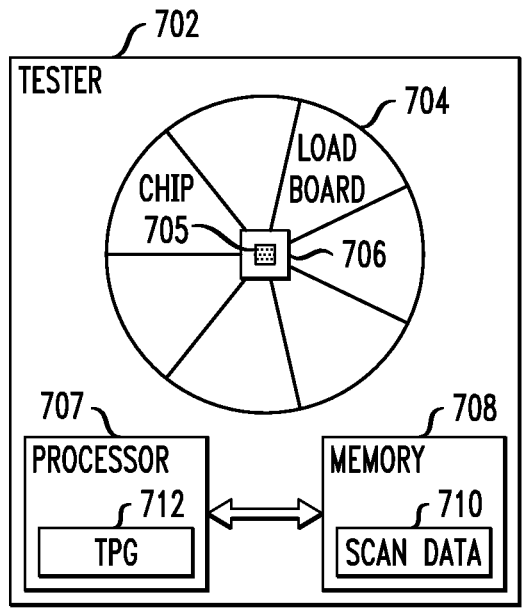
FIG. 7 shows one possible implementation of the testing system of FIG. 1.

The tester 102 in the testing system 100 of FIG. 1 need not take any particular form, and various conventional testing system arrangements can be modified in a straightforward manner to support the clock control functionality disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored program code. In the present embodiment, processor 707 is shown as implementing a test pattern generator 712, which may be implemented as an ATPG. Associated scan data 710 is stored in memory 708. Numerous alternative testers may be used to perform scan testing of an integrated circuit as disclosed herein. Also, as indicated previously, in alternative embodiments at least portions of the tester 702 may be incorporated into the integrated circuit itself, as in BIST arrangement.

Figure 8:
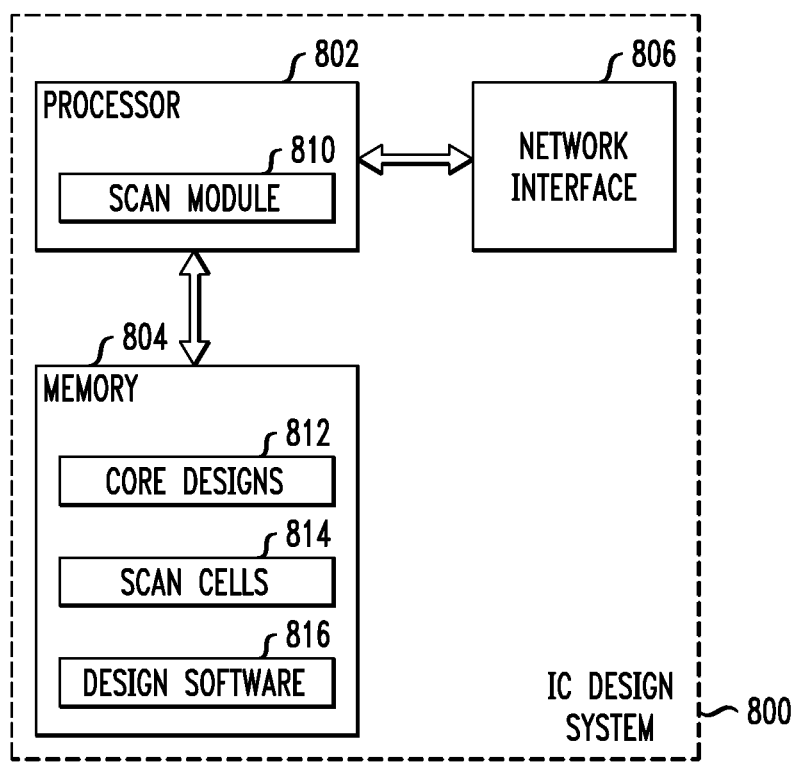
FIG. 8 is a block diagram of a processing system for generating an integrated circuit design comprising clock control elements of the types illustrated in FIGS. 3, 5 and 6.

The insertion of scan chains 204 and associated clock control elements 225 of a given integrated circuit design may be performed in a processing system 800 of the type shown in FIG. 8. Such a processing system in this embodiment more particularly comprises a design system configured for use in designing integrated circuits such as integrated circuit 104 to include scan chains 204 and associated clock control elements 225.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated clock control elements in the manner disclosed herein, in conjunction with utilization of integrated circuit design software 816.

By way of example, the scan chain circuitry 106 comprising scan chains 204 and associated clock control elements 225 may be generated in system 800 using an RTL description and then synthesized to gate level using a specified technology library. A test generation model may then be created for generating test patterns using a test generation tool. Control files or other types of input files may be used to provide the test generation tool with information such as the particular scan chain portions that are driven by clock signals of particular clock domains in a given embodiment. Once the corresponding rules are in place, a rule checker may be run so that the test generation tool has visibility of the scan chains taking into account the operation of the clock control elements. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan chain and clock control functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices. The memory 708 of FIG. 7 may be viewed as another illustrative example of a computer program product as the latter term is used herein.

As indicated above, embodiments of the invention may be implemented in the form of integrated circuits. In a given such integrated circuit implementation, identical die are typically formed in a repeated pattern on a surface of a semiconductor wafer. Each die includes scan test circuitry, a clock distribution network and associated clock control elements, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

It should again be emphasized that the embodiments of the invention as described herein are intended to be illustrative only. For example, other embodiments of the invention can be implemented using a wide variety of other types of scan test circuitry, with different types and arrangements of scan cells, as well as different types and arrangements of clock distribution networks, clock control elements and control signaling, than those included in the embodiments described herein. These and numerous other alternative embodiments within the scope of the following claims will be readily apparent to those skilled in the art.

What is claimed is:

1. An integrated circuit comprising:
    scan test circuitry comprising at least one scan chain having a plurality of scan cells;
    additional circuitry subject to testing utilizing the scan test circuitry; and
    a clock distribution network configured to provide a plurality of clock signals to respective portions of the integrated circuit;
    the clock distribution network comprising:
    a clock tree having a plurality of clock signal lines; and
    a plurality of clock control elements arranged in respective selected ones of the clock signal lines of the clock tree and configured to separate at least one synchronous clock domain into a plurality of asynchronous clock domains during scan testing.

2. The integrated circuit of claim 1 wherein the clock control elements are configured to reduce a number of timing exceptions produced during scan testing relative to a number of timing exceptions that would otherwise be produced during scan testing if scan testing were performed using the corresponding synchronous clock domain.

3. The integrated circuit of claim 1 wherein the synchronous clock domain is defined as a synchronous clock domain for purposes of scan testing but is separable into the plurality of asynchronous clock domains by the clock control elements for at least an at-speed capture portion of the scan testing.

4. The integrated circuit of claim 1 wherein the clock tree comprises at least one stem signal line and a plurality of branch signal lines.

5. The integrated circuit of claim 1 wherein a given stem signal line associated with a particular clock signal and a given branch signal line associated with that same clock signal include respective ones of the clock control elements.

6. The integrated circuit of claim 1 wherein particular clock signal lines of the clock tree that are selected to include the clock control elements are selected based on a static timing analysis of the integrated circuit design that involves comparing a number of timing exceptions produced during scan testing with a number of timing exceptions produced during functional operation.

7. The integrated circuit of claim 6 wherein particular clock signal lines of the clock tree that are selected to include the clock control elements are selected such that the number of timing exceptions produced during scan testing is no more than a specified amount greater than the number of timing exceptions produced during functional operation.

8. The integrated circuit of claim 1 wherein a given one of the clock control elements is configured to multiplex between a functional clock signal, a scan capture clock signal and a scan shift clock signal responsive to scan enable and scan mode signals.

9. The integrated circuit of claim 8 wherein the scan capture clock signal is configured for at-speed scan capture.

10. A processing device comprising the integrated circuit of claim 1.

11. A method comprising:
providing clock signals to respective portions of an integrated circuit using a clock tree having a plurality of clock signal lines; and
configuring a plurality of clock control elements arranged in respective selected ones of the clock signal lines of the clock tree so as to separate at least one synchronous clock domain into a plurality of asynchronous clock domains during scan testing.

12. The method of claim 11 further comprising:
adjusting the clock control elements such that a number of timing exceptions produced during scan testing is reduced relative to a number of timing exceptions that would otherwise be produced during scan testing if scan testing were performed using the corresponding synchronous clock domain.

13. The method of claim 11 further comprising:
defining the synchronous clock domain as a synchronous clock domain for purposes of scan testing; and
utilizing the clock control elements to separate the synchronous clock domain into the plurality of asynchronous clock domains for at least an at-speed capture portion of the scan testing.

14. The method of claim 11 further comprising:
selecting particular clock signal lines of the clock tree to include the clock control elements based on a static timing analysis of the integrated circuit design that involves comparing a number of timing exceptions produced during scan testing with a number of timing exceptions produced during functional operation.

15. The method of claim 11 further comprising:
selecting particular clock signal lines of the clock tree to include respective clock control elements such that the number of timing exceptions produced during scan testing is no more than a specified amount greater than the number of timing exceptions produced during functional operation.

16. A non-transitory computer-readable storage medium having computer program code embodied therein for use in scan testing an integrated circuit, wherein the computer program code when executed in a testing system causes the testing system to perform the method of claim 11.

17. A clock distribution network comprising:
a clock tree having a plurality of clock signal lines; and
a plurality of clock control elements arranged in respective selected ones of the clock signal lines of the clock tree and configured to separate at least one synchronous clock domain into a plurality of asynchronous clock domains during scan testing.

18. The clock distribution network of claim 17 wherein the synchronous clock domain is defined as a synchronous clock domain for purposes of scan testing but is separable into the plurality of asynchronous clock domains by the clock control elements for at least an at-speed capture portion of the scan testing.

19. The clock distribution network of claim 17 wherein a given one of the clock control elements is configured to multiplex between a functional clock signal, a scan capture clock signal and a scan shift clock signal responsive to scan enable and scan mode signals.

20. A processing system comprising:
a processor; and
a memory coupled to the processor and configured to store information characterizing an integrated circuit design;
wherein the processing system is configured to provide scan test circuitry and a clock distribution network within the integrated circuit design, the scan test circuitry comprising at least one scan chain having a plurality of scan cells, the clock distribution network being configured to provide a plurality of clock signals to respective portions of the scan test circuitry;
the clock distribution network comprising:
a clock tree having a plurality of clock signal lines; and
a plurality of clock control elements arranged in respective selected ones of the clock signal lines of the clock tree and configured to separate at least one synchronous clock domain into a plurality of asynchronous clock domains during scan testing.

21. The integrated circuit of claim 1 wherein a given one of the clock control elements comprises:
a first multiplexer;
a second multiplexer; and
a logic gate.

22. The integrated circuit of claim 21 wherein:
a scan capture clock signal is applied to a first input of the first multiplexer;
a shift clock signal is applied to a second input of the first multiplexer; and
a select signal input of the first multiplexer is driven by an output of the logic gate.

23. The integrated circuit of claim 22, wherein:
a functional clock signal is applied to a first input of the second multiplexer;
an output of the first multiplexer is applied to a second input of the second multiplexer; and
an output of the second multiplexer comprises an at-speed clock signal.

24. The integrated circuit of claim 21 wherein the logic gate comprises an OR gate which receives as its inputs a scan enable signal and a bypass signal.

* * * * *